(12) United States Patent  
Capofreddi

(10) Patent No.: US 6,553,398 B2
(45) Date of Patent: Apr. 22, 2003

(54) ANALOG FIR FILTER WITH PARALLEL INTERLEAVED ARCHITECTURE

(75) Inventor: Peter Capofreddi, San Francisco, CA (US)

(73) Assignee: Santel Networks, Inc., Fremont, CA (US)

( * ) Notice: Subject to any disclaimer, the term of this patent is extended or adjusted under 35 U.S.C. 154(b) by 0 days.

(21) Appl. No.: 09/957,137

(22) Filed: Sep. 19, 2001

(65) Prior Publication Data

US 2002/0062329 A1 May 23, 2002

Related U.S. Application Data

(60) Provisional application No. 60/234,272, filed on Sep. 20, 2000.

(51) Int. Cl.[7] ............................. G06F 17/00; G06G 7/02
(52) U.S. Cl. ....................................... 708/319; 708/819
(58) Field of Search ................................ 708/316, 319, 708/819

(56) References Cited

U.S. PATENT DOCUMENTS

| | | | |
|---|---|---|---|
| 4,811,263 A | 3/1989 | Hedley et al. | 364/724.13 |
| 5,016,207 A | 5/1991 | Fujii et al. | 364/724.01 |
| 5,204,827 A | * 4/1993 | Fujita et al. | 708/319 |
| 5,311,459 A | 5/1994 | D'Luna et al. | 364/754 |
| 6,032,171 A | 2/2000 | Kiriaki et al. | 708/819 |
| 6,035,312 A | 3/2000 | Hasegawa | 708/322 |
| 6,058,407 A | 5/2000 | Kim | 708/319 |
| 6,125,155 A | 9/2000 | Lesthievent et al. | 375/350 |

* cited by examiner

*Primary Examiner*—Tan V. Mai
(74) *Attorney, Agent, or Firm*—Blakely, Sokoloff, Taylor & Zafman LLP

(57) ABSTRACT

An analog FIR filter that processes multiple output samples in parallel is disclosed. The simultaneous parallel processing of multiple samples permits improved sampling rate and improved accuracy as compared to prior art filters.

5 Claims, 8 Drawing Sheets

ANALOG FIR FILTER WITH PARALLEL INTERLEAVED ARCHITECTURE

RELATED APPLICATION

This application is a continuation of U.S. Provisional Application Ser. No. 60/234,272, filed Sep. 20, 2000. That disclosure is incorporated in this document by reference.

BACKGROUND OF THE INVENTION

For signals with very high bandwidth, analog filtering is often more economical than digital filtering. Even where costs are less important, there are still cases where analog filtering is the only viable method for performing signal-processing functions.

Examples of high-bandwidth signals that may require analog filtering include disk drive read channels, radio communication channels, wireline communication channels and fiber-optic communication channels. The types of processing that must be performed on these signals include channel response equalization and channel phase compensation.

Three broad categories encompass several prior art analog filters. These categories may be distinguished based on the type of method each uses to create signal delays during the filtering process.

In FIG. 1, a representative continuous-time integrator based filter is shown and generally designated 100. Filter 100, and other filters included in this category generate signal delays using a series of integrators 102 (that are individually labeled in FIG. 1 as 102a–102n). Each integrator 102 is typically implemented as an inductor or capacitor. The primary disadvantage of this type of filter is that it cannot compensate for distributed or noncausal errors in the channel.

FIG. 2 shows an example of a continuous-time transmission-line based filter 200. Unlike Filter 100, Filter 200 has a finite impulse response (FIR) (i.e., the filter is non-recursive and does not process feedback). For Filter 200, signal delays are generated by a plurality of transmission lines 202. Each transmission line 202C is typically implemented as a stripline. The primary disadvantage of the type of filter is that the transmission lines are physically large. As a result, it is difficult to implement circuits of this type in integrated-circuit technologies.

FIG. 3 shows an example of a discrete-time analog filter 300. In this type of filter, delays are generated by a series of sample-and-hold circuits 302. Filter 300 has a finite impulse response (FIR) and is further described in U.S. Pat. No. 4,316,258, issued to Berger, et. al., for an invention entitled "Digitally programmable filter using electrical charge transfer".

Operation of filter 300 can be described as follows: The first sample and hold circuit 302a samples the input signal x(t) at uniformly spaced times 0, T, 2T, . . . and generating samples x(0), x(T), x(2T), . . . The second sample and hold circuit 302b samples the output of sample and hold circuit 302a before sample and hold circuit 302a acquires a new sample (e.g., between times O and T), thus obtaining the previous sample value (e.g., x(o)). Therefore, at time t+kT, the output of circuit 302a is x(kT) whereas the output of circuit 302b is x((k−1)T). Each sample and hold circuit 302I behaves in this manner relative to its preceding circuit. The output of each sample and hold circuit 302n at time t=kT is therefore as shown in FIG. 3. To perform the filtering, each of the output samples Sn from each circuit 302n is multiplied by a coefficient Cn, and the resulting products are then added together. The result is a filtered version of the sampled input signal with the filter transfer function given by:

$$H(z) = C_0 + C_1 z^{-1} + C_2 z^{-2} + \ldots$$

where z is the unit delay operator. The filter architecture of FIG. 3 suffers from several significant disadvantages. First each sample and hold circuit 302n samples during the hold phase of the preceding sample and hold circuit 302 in the pipeline, thus requiring two track-and-holds for each filter tap. Second, noise, offset, and nonlinearity errors accumulate as the signal propagates along the chain of sample and hold circuits 302. See S. Kiriaki, T. L. Viswanathan, G. Feygin, B. Stazewski, R. Pierson, B. Krenik, M. de Wit, K. Nagaraj, "A 160-MHz Analog Equalizer for Magnetic Disk Read Channels", IEEE Journal of Solid State Circuits, vol. 32, no. Nov. 11, 1997, pp. 1839–1850.

An architecture that does not have these two disadvantages is illustrated by filter 400 of FIG. 4. Filter 400 has a finite impulse response. Filter 400 includes a series of n+1 track and hold circuits 402, a crosspoint switch matrix 404, a series of n multipliers 406 and an adder 408.

Track and hold circuits 402 have two operational states. During track mode, track and hold 402 transfers their input to their outputs with a gain of one. During hold mode, track and hold circuits 402 outputs their last transferred values. This differs from sample and hold circuits, which output sample value without having a tracking (transfer or pass-through) mode.

Crosspoint switch matrix 404 has n+1 inputs and n outputs. Each track and hold circuit 402 is connected to one of these inputs. Each of these outputs is connected to a respective multiplier 406i. The outputs of multipliers 406 are connected to the n inputs of an adder 408. Crosspoint 404 switch matrix contains a switch connecting each of its (n+1) inputs to each of its n outputs, with one switch per output being closed at any given time. This allows crosspoint switch matrix 404 to select any set of n inputs from among the n+1 inputs and pass that set of n inputs to its n outputs.

A control circuit (not shown) clocks and controls the operation of filter 400. During each clock period, the control circuit causes one track and hold circuit 402 (known as the active track and hold circuit 402) to track the input signal. This means that the active track and hold 402 transfers its input (the input signal) to its output with a gain of one. The control circuit causes the remaining track and hold circuits 402 to remain in hold mode. Each of these track and hold circuits 402 outputs its last transferred value of the input signal. During subsequent clock periods, the control circuit causes the active track and hold circuit 402 to rotate among the series of track and hold circuits 402.

At time t=kT, valid samples will be present in the inactive track and holds, the samples representing x((k−1)T), x((k−2)T), . . . x((k−n)T). The location of the samples at the inputs to matrix 404 will be different at each instant of time. However, because of the rotating nature of the sampling, e.g., the control circuit configures the crosspoint switch matrix 404 to map the inputs from the appropriate track and hold circuits 402 (i.e., the track and hold circuits 402 having valid sample values) to respective multipliers 406. The multiplied samples are forwarded to adder 408. Adder 408 sums the multiplied samples to form a filtered output signal y[k].

Filter 400 suffers from several disadvantages. First, the number of switches in crosspoint switch matrix 404 grows roughly as the square of the number of taps:

$$N_{switch} = n(n+1)$$

The large number of switches results in a large parasitic capacitance at each of the input and output terminals of crosspoint switch matrix 404. This limits the speed of operation of the circuit. Second, the sampled signal must traverse the entire signal path, including crosspoint switch matrix 404, multipliers 406 and adder 408, within one clock cycle. For systems with high sampling rates (typically above 1–5 GHz), certain integrated circuit technology is not fast enough to perform all the processing with sufficient accuracy within the sample period. As a result, filters using this architecture may suffer from a bottleneck in terms of sampling rate and accuracy.

Additional description of Filter 400 may be found in: 1) S. Kiriaki, T. L. Viswanathan, G. Feygin, B. Stazewski, R. Pierson, B. Krenik, M. de Wit, K. Nagaraj, "A 160-MHz Analog Equalizer for Magnetic Disk Read Channels", IEEE Journal of Solid State Circuits, vol. 32, no. Nov. 11, 1997, pp. 1839–1850. 2) Kiriaki, et al., "FIR filter architecture", U.S. Pat. No. 6,035,320, Mar. 7, 2000. 3) Carley, "Sample and hold circuit and finite impulse response filter constructed therefrom", U.S. Pat. No. 5,414,311, May 9, 1995.

For these and other reasons, a need exists for improved methods for analog filtering. This need is present in cases where bandwidth requirements are high and error rates are required to be low.

SUMMARY OF THE INVENTION

The present invention relates to an improved FIR filter architecture that calculates m samples of the filter output in parallel (where m>1). The m parallel outputs (designated y[k], y[k−1] . . . y[k−m]) can be used in parallel, typically as the inputs to a series of parallel analog to converters.

Each output y is generated by multiplying n samples of an input signal x by respective coefficients ($C_0$, $C_1$ . . . $C_{n-1}$) and combining the results. Each output y is generated using a shifted series of samples as follows:

$$y[k] = C_0 x((k-1)T) + C_1 x((k-2)T) + C_2 x((x-3)T) \ldots + C_{n-1} x((k-n)T)$$

$$y[k-1] = C_0 x((k-2)T) + C_1 x((k-3)T) + C_2 x((x-4)T) \ldots + C_{n-1} x((k-n-1)T)$$

and so on.

A sampling network generates the samples. The sampling network includes a series of sample and hold circuits arranged in m parallel paths. The first of the m parallel paths generates samples of the form:

x(kT), x((k−m)T), x((k−2m)T) . . .

The second parallel path is shifted by one sampling period and generates samples of the form:

x((k−1)T), x((k−m+1)T), x((k−2m+1)T) . . .

Each successive parallel path is further shifted and generates samples in an analogous fashion.

Each output y, is generated using a mixture of the samples generated by the parallel paths. As a specific example, consider the case of a FIR filter that generates two outputs in parallel (i.e., m=2) and generates five samples for each output (i.e., n=5). For a filter of this type. The first output y[k] is defined by the equation:

$$y[k] = C_0 x(kT) + C_1 x((k-1)T) + C_2 x((x-2)T) + C_3 x((k-3)T) + C_4 x((k-4)T)$$

The second output y[k−1] is defined by the equation:

$$y[k-1] = C_0 x((k-1)T) + C_1 x((k-2)T) + C_2 x((x-3)T) + C_3 x((k-4)T) + C_4 x((k-5)T)$$

For this particular implementation, the sampling network includes two parallel paths. The first generates the samples: x(kT), x((k−2)T) and x((k−4)T). The second parallel path generates the samples x((k−1)T), x((k−3)T) and x((k−5)T).

The output y[k] is created using the first, second and third samples generated by the second parallel path and the first and second samples generated by the first parallel path.

The output y[k−1] is generated using the second and third samples generated by the first parallel path and the first, second and third samples generated by the second parallel path.

DETAILED DESCRIPTION

Figure 1:
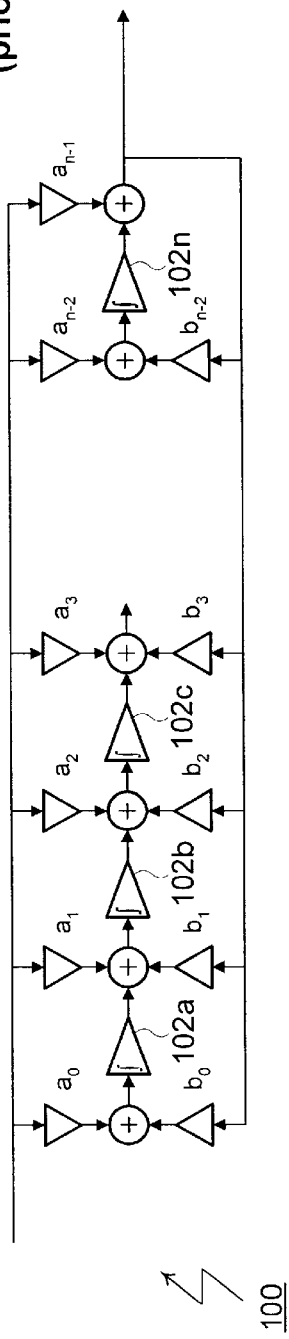
FIG. 1 is a block diagram showing a prior art continuous-time integrator based filter.
Figure 2:
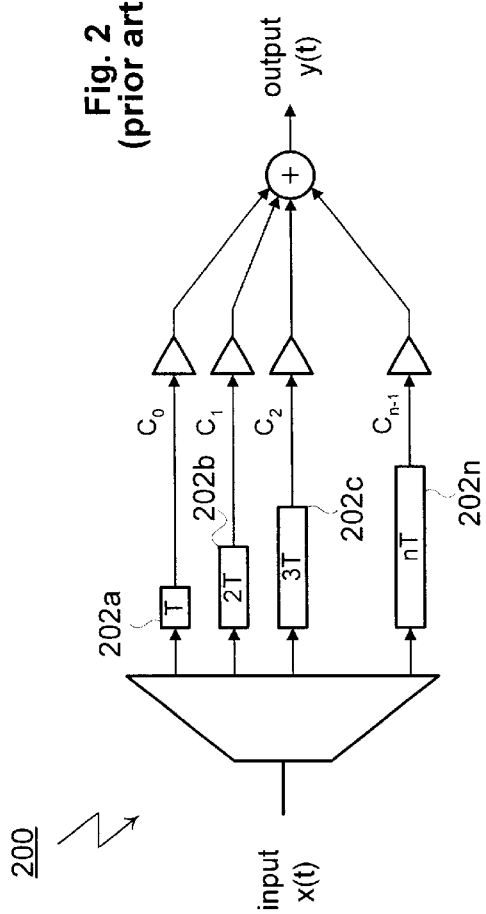
FIG. 2 is a block diagram showing a prior alt continuous-time transmission-line based filter.
Figure 3:
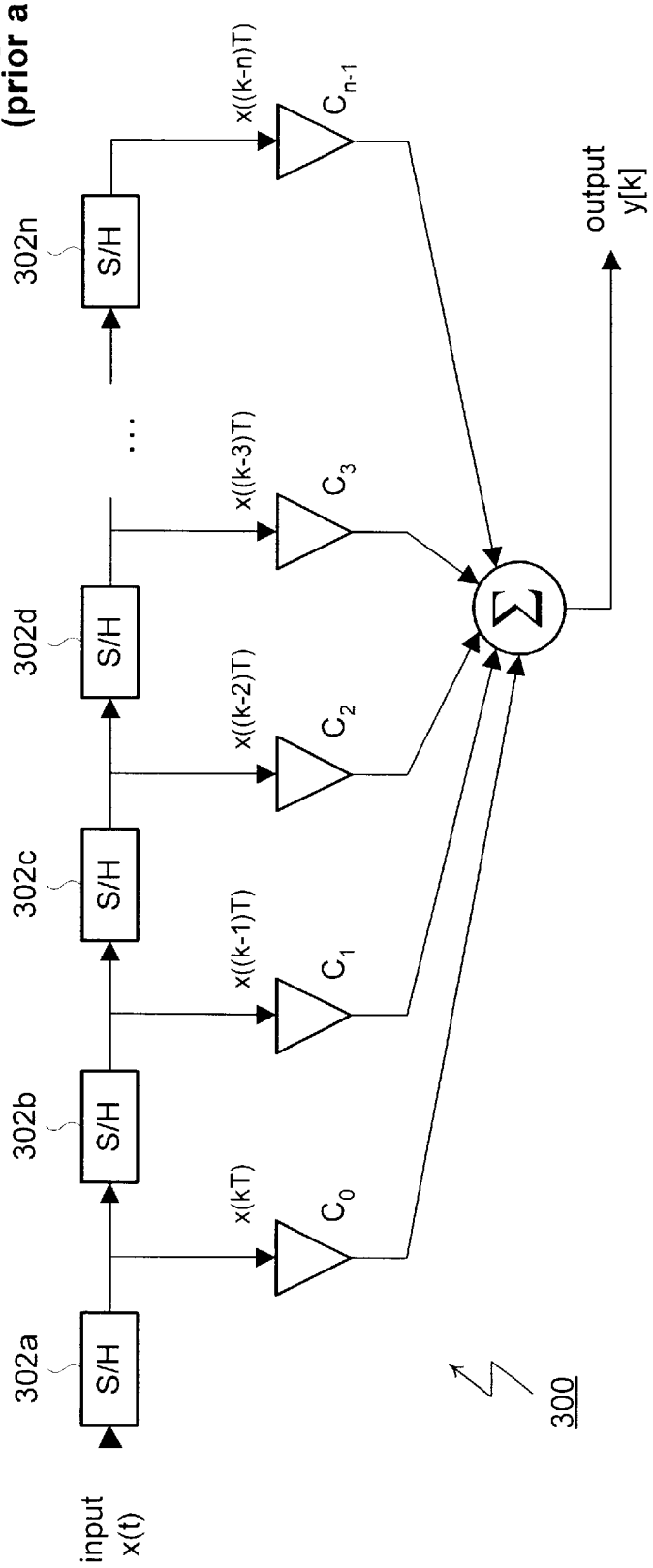
FIG. 3 is a block diagram showing a prior art discrete-time analog filter.
Figure 4:
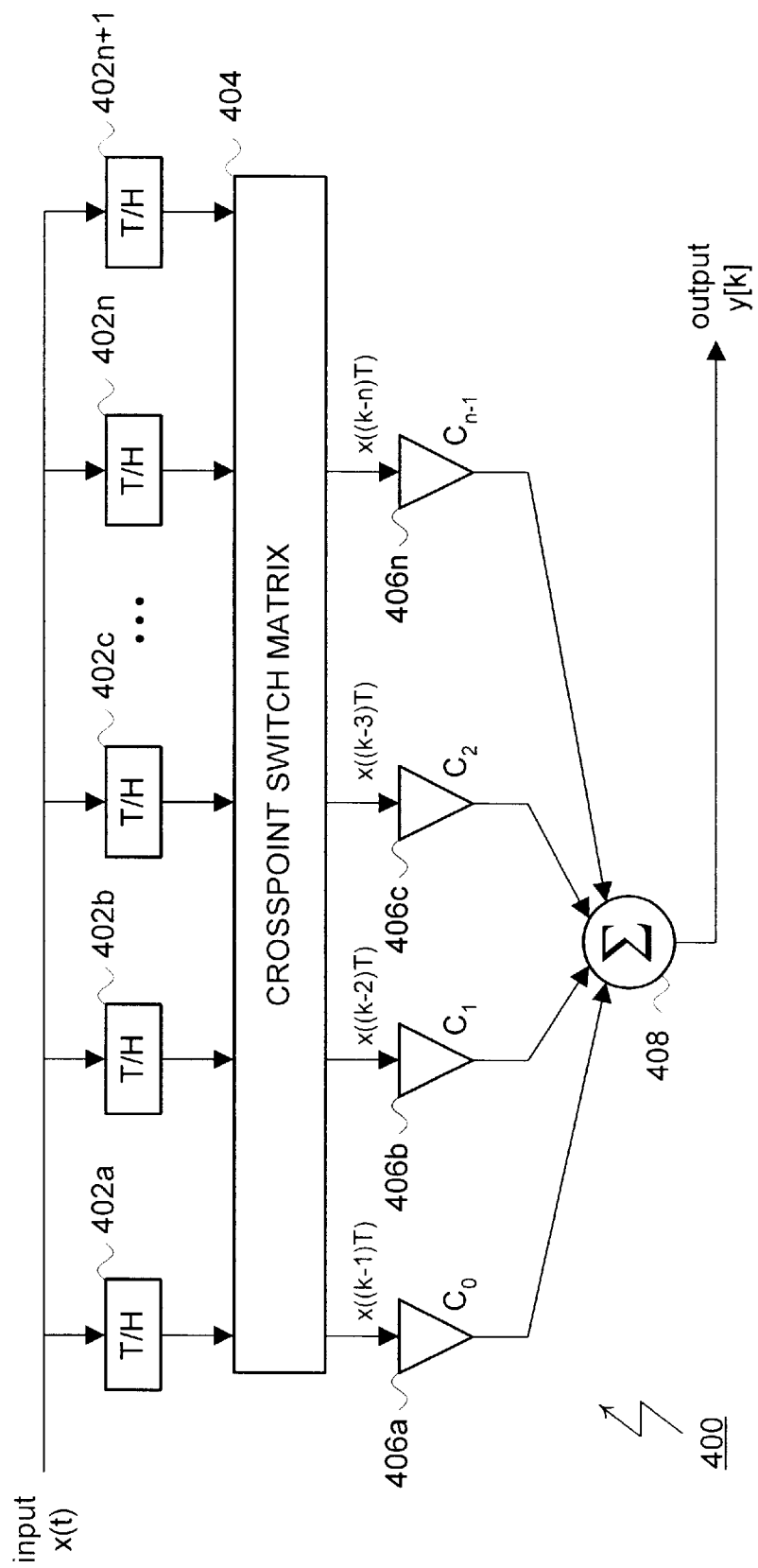
FIG. 4 is a block diagram showing a prior art FIR filter.
Figure 5:
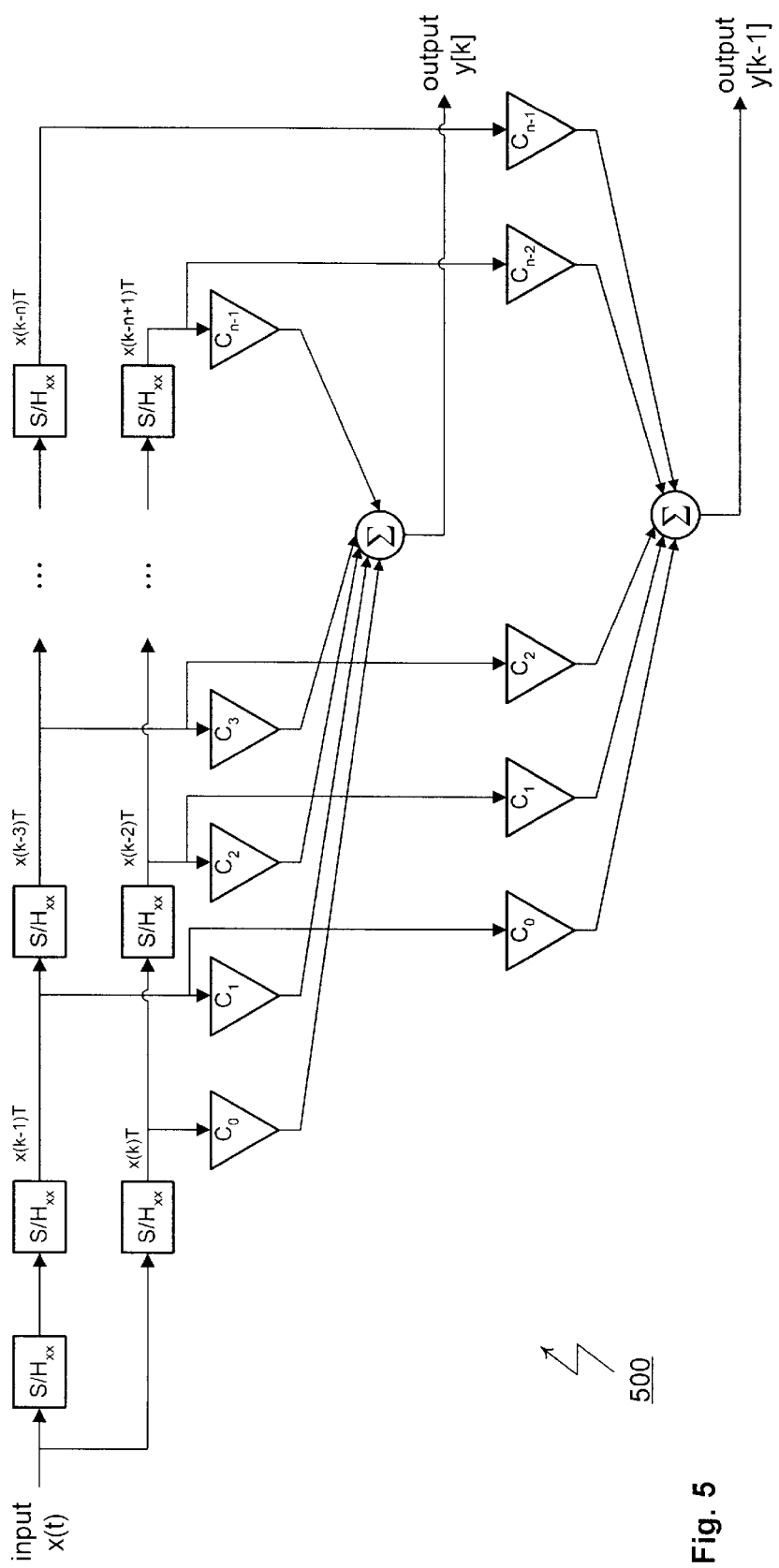
FIG. 5 is a block diagram showing an embodiment of the FIR filter of the present invention.

The present invention relates to an improved FIR filter architecture that calculates m samples of the filter output in parallel (where m>1). In FIG. 5, a FIR Filter 500 is shown as an example of this filter architecture. Filter 500 produces two parallel outputs (i.e., m=2). These are referred to as y[k] and y[k−1].

Outputs y[k] and y[k−1] are produced as functions of an analog input signal designated x(t) (where t represents time). Filter 500 samples the value x(t) on a repeating, periodic basis. This description refers to the period between successive samples as the sample period or T. For the purposes of description, the sampling instant is referred to as k*T or kT. The immediately preceding sampling instants are referred to as (k−1)T,(k−2)T and so on.

Each output y is generated by multiplying n samples of the input signal x(t) by respective coefficients ($C_0, C_1 \ldots C_{n-1}$) and combining the results. The general form for this multiplication and summation is as follows:

$$y[k] = C_0 x((k-1)T) + C_1 x((k-2)T) + C_2 x((x-3)T) \ldots + C_{n-1} x((k-n)T)$$

$$y[k-1] = C_0 x((k-2)T) + C_1 x((k-3)T) + C_2 x((x-4)T) \ldots + C_{n-1} x((k-n-1)T)$$

Additional outputs (i.e., where m>2) would be generated using analogous equations.

The sample values x(kT), x((k−1)T), x((k−2)T) . . . are generated by a sampling network. As shown in FIG. 5, the sampling network is organized into m (in this case two) parallel paths. Each parallel path includes a series of sample and hold circuits. The first generates the samples: x(kT), x((k−2)T) . . . x((k−n+1)T). The second parallel path generates the samples x((k−1)T), x((k−3)T) and x((k−n)T). In each path, successive samples are separated by m sampling periods. For example, the sample taken at kT in the first path is followed by a sample taken at (k−2)T. Each parallel path is shifted by a value of one sampling period. Thus, the second path starts with a sample at (k−1)T while the first path starts with a sample taken at kT. In this way, the entire sequence of sample from x(kT) to x((k−n) T) are distributed between the two sampling paths. If m were greater than two an analogous distribution would be used.

Filter 500 generates two output values during each sampling period T. The number of sample and hold circuits is approximately the same as prior art implementations. At the same time, the clock frequency of each shift and hold circuit is reduced by a factor of m, from 1/T to 1/mT. The amount of time available for the input signal x(t) to traverse the multipliers and adders is increased to mT.

Figure 6:
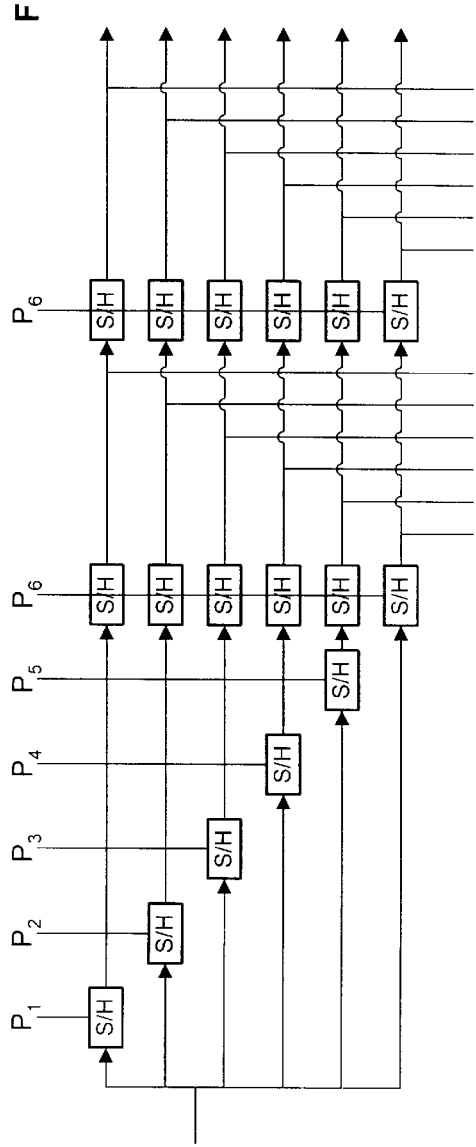
FIG. 6 is a block diagram showing an embodiment of a sampling network suitable for use with the FIR filter of the FIG. 5.
Figure 7:
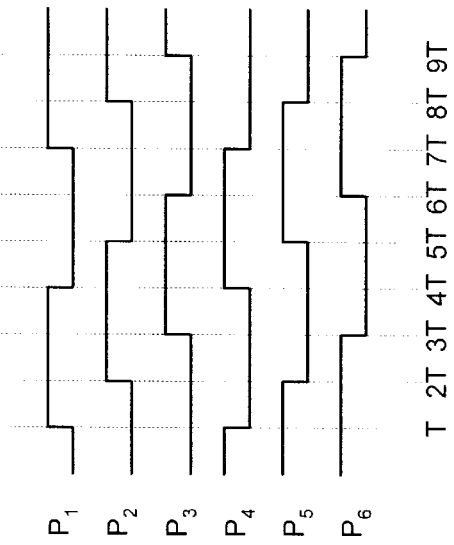
FIG. 7 is a timing diagram showing operation of the track and hold circuits included in the filter of FIG. 5.

FIG. 6 shows a sampling network, this time for an implementation that includes six parallel outputs (m=6). As shown in FIG. 6, the operation of the sample and hold circuits is controlled by a series of clock phases $P_1 \ldots P_6$. The individual waveforms for these clock phases are shown in FIG. 7. Each sample and hold samples the input signal on the rising edge of the corresponding clock phase. The rising edge of the clock phases are staggered to produce staggered samples in each of the parallel input paths. In this way, the first sample and hold in each parallel path controls the "stagger" of that path. The remaining sample and holds are clocked by the same clock phase making the staggered samples move through the parallel paths in lock-step.

Figure 8:
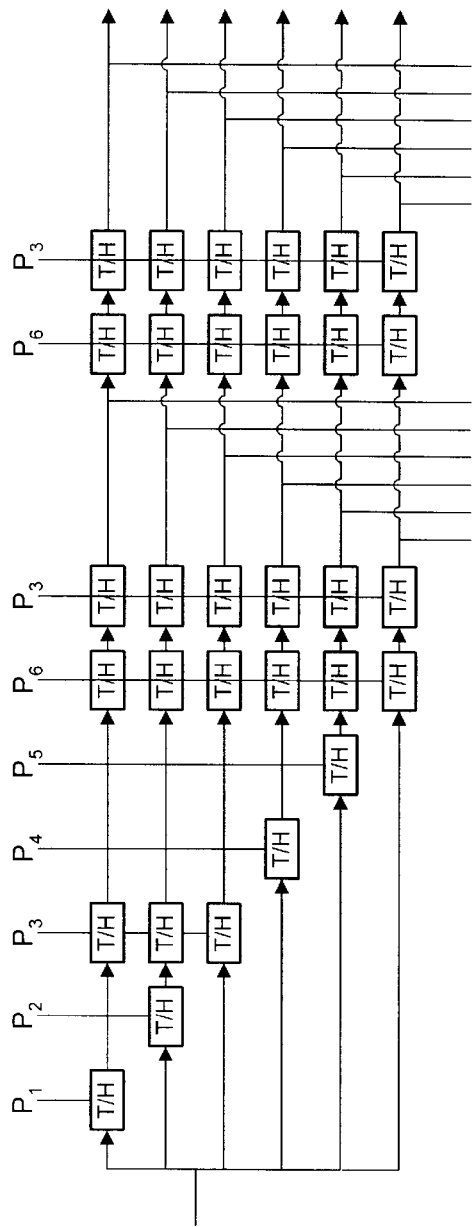
FIG. 8 is a block diagram showing an embodiment of a sampling network with reduced track and hold circuits.

Within the sampling network, each sample and hold circuit is typically implemented as a combination of two track and hold circuits. The two track and holds within a sample and hold are enabled on opposite polarities of the clock phase input to the sample and hold. FIG. 8 shows a preferred implementation for the sampling network of FIG. 6. In FIG. 8, all redundant track and hold circuits have been eliminated. The track and holds shown in FIG. 8 are the minimum required to ensure that the inputs to the multipliers change only once every m sample periods.

Figure 9:
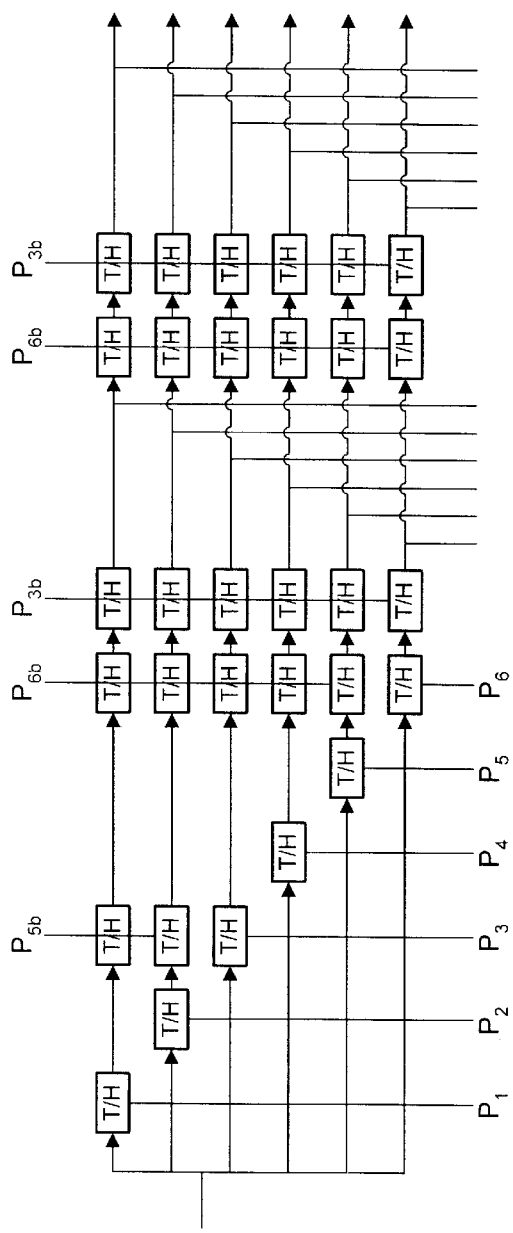
FIG. 9 is a block diagram showing an embodiment of a sampling network with reduced track and hold circuits and equalized clock driver loading.

FIG. 9 shows the sampling network of FIG. 8. In this case, however, the clock phases that connect to the initial track and hold in each sampling path have been separated from the clock phases that connect to the rest of the sampling network. This makes the loading on the clock drivers symmetric for all m of the clock phases that connect to the initial track and hold circuits. Symmetric loading improves the uniformity of sampling between the various track and hold circuits.

Figure 10:
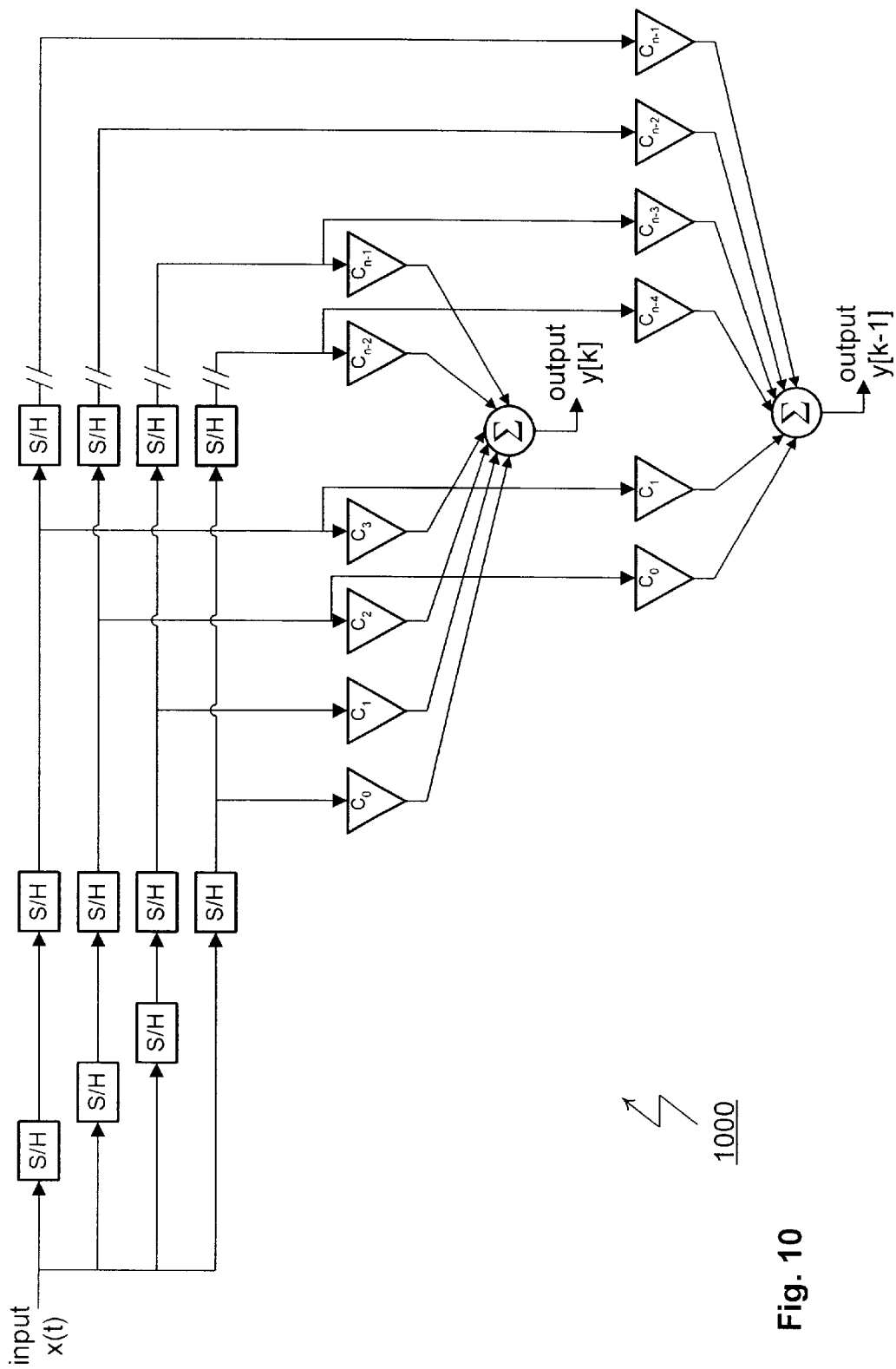
FIG. 10 is a block diagram showing an embodiment of an oversampling FIR filter according to the present invention.

In FIG. 10, a FIR Filter 1000 is shown as a second example of the improved FIR filter architecture. Filter 1000 (like Filter 500) produces two parallel outputs y[k] and y[k−1]. Unlike Filter 500, however Filter 1000 is configured to operate as an oversampling filter. This means that Filter 1000 samples input x(t) more frequently than it produces outputs y[k] and y[k−1]. The ratio between input sampling and output production is referred to as the oversampling ratio. For a given over oversampling ration of p, Filter 1000 includes a total of m*p parallel input paths.

Figure 11:
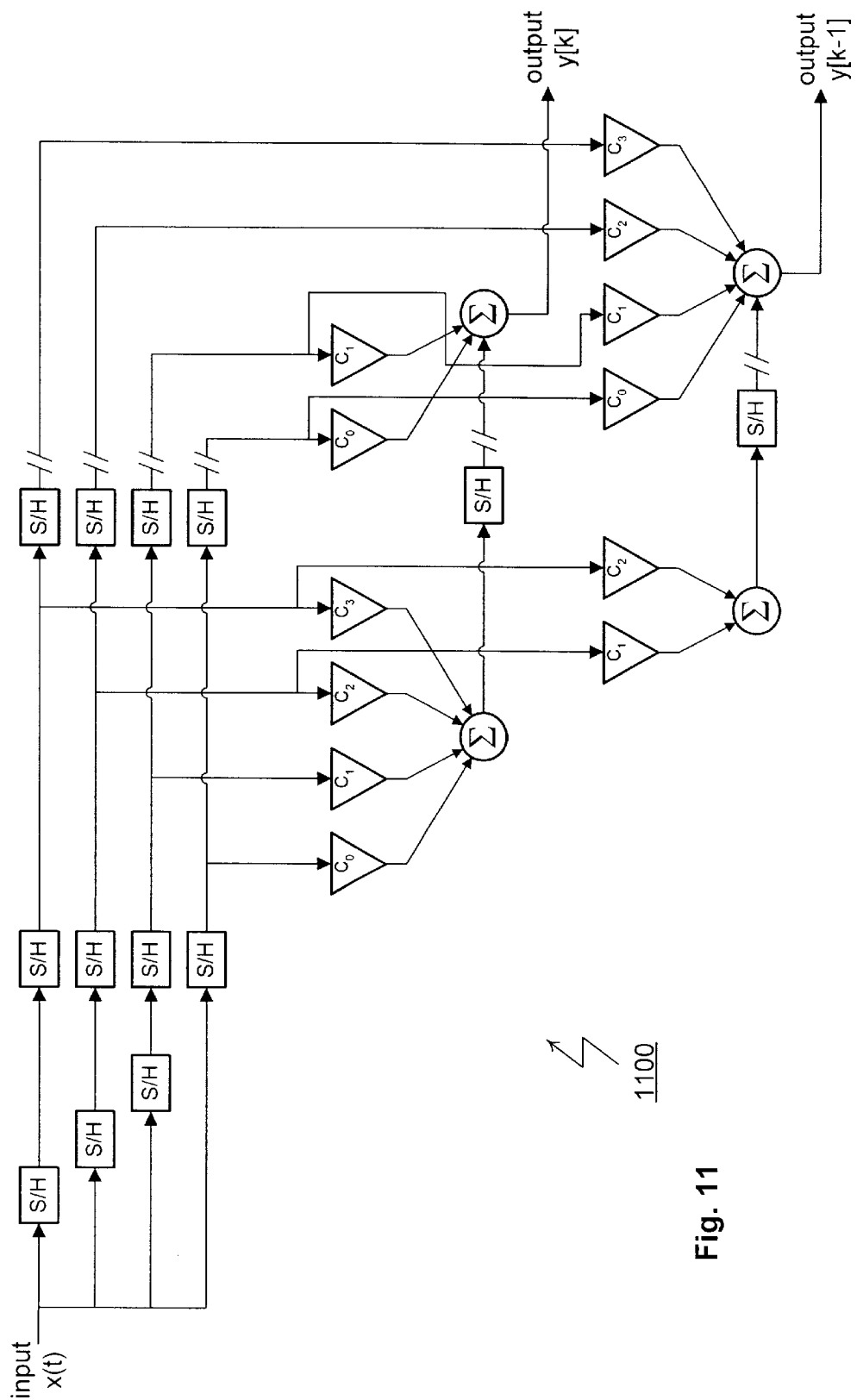
FIG. 11 is a block diagram showing another embodiment of an oversampling FIR filter according to the present invention.

FIG. 11, shows a second implementation for an oversampling FIR filter. Filter 1100 uses m*p parallel inputs to generate m parallel outputs (e.g., outputs y[k] and y[k−1] for m equals two). Unlike Filter 1000, Filter 1100 uses a transposed filter structure in which some of the delays are generated as part of the output (i.e., multiply and accumulate) stage. This is accomplished by relocating some of the sample and hold circuits from the parallel input paths to the output stage. The oversampling nature of Filter 1100 means that the output stage functions at a lower clock rate than is required for the parallel input paths. As a result, relocation of the sample and holds allows Filter 1100 to consume less power and reduces design complexity.

In each of the previously described embodiments, it is important to note that The reduced clock rate allows for more settling time in the sample and holds, and therefore results in improved accuracy as compared to a conventional analog FIR filter. For an embodiment with m parallel paths, the settling time is increased by a factor of m.

The reduced clock rate allows for more settling time in the multiplier/adder network used to generate the output samples, and therefore results in improved accuracy as compared to a conventional analog FIR filter. For an embodiment with m parallel paths, the settling time is increased by a factor of m.

The shorter length of the sample and hold pipeline chains results in improved accuracy as compared to a conventional analog FIR filter. This is because each stage in the sample and hold pipeline chain adds noise and distortion. The noise and distortion accumulate as the signal progresses along the pipeline. The number of sample and hold stages that the signal must traverse is reduced from n in the conventional FIR filter implementation to (n−1)/m+1 in the invention. The noise introduced by the sample and holds is therefore reduced by 10*log([(n−1)/m+1]/n) dB and distortion introduced by the sample and holds is reduced by 20*log([(n−1)/m+1]/n) dB.

Although particular embodiments of the present invention have been shown and described, it will be obvious to those skilled in the art that changes and modifications may be made without departing from the present invention in its broader aspects, and therefore, the appended claims are to encompass within their scope all such changes and modifications that fall within the true scope of the present invention.

What is claimed is:

1. A filter, comprising:
   an input port;
   m parallel input paths coupled to receive an input signal from the input port, each of the parallel input paths including a plurality of output taps with each of the output taps representing a sample value of the input signal at a particular point in time as determined by a sample period of the filter, the m parallel input paths being arranged so that successive samples of the input signal within each input path are separated from one another by m sample periods with a first sample in each of the m parallel input paths being shifted from a predecessor one of the input paths by one sample period; and m output paths, each coupled to receive a subset of the output taps of the m input paths such that successive samples are received from successive ones of the input paths in a round-robin fashion and to produce an output signal that is a summation of products of selected ones of the output taps with weight coefficients.

2. The filter of claim 1 wherein each input path comprises a number of sample and hold circuits coupled in series.

3. The filter of claim 1 wherein one of the m output paths produces an output value having the form:

$$y[k] = C_0 x((k-1)T) + C_1 x((k-2)T) + C_2 x((k-3)T) \ldots + C_{n-1} x((k-n)T),$$

where T is the sample period of the filter and values $C_0$–$C_{n-1}$ are the weight coefficients.

4. The filter of claim 2 wherein each sample and hold circuit comprises two track and hold circuits.

5. The filter of claim 1 wherein the output paths are clocked at a different rate than the input paths.

* * * * *